US012745598B2

(12) United States Patent
Kuo et al.

(10) Patent No.: US 12,745,598 B2
(45) Date of Patent: Sep. 22, 2026

(54) WAFER STORAGE DEVICE WITH PARTICLE-ATTRACTION OBJECT

(71) Applicant: Taiwan Semiconductor Manufacturing Company Limited, Hsin-Chu (TW)

(72) Inventors: Yuan-Cheng Kuo, Kaohsiung City (TW); Chi-Chung Jen, Kaohsiung City (TW); Kai-Hung Hsiao, Kaohsiung City (TW); Pei-Huang Hsu, Tainan City (TW); Chih-Hsiung Huang, Hsinchu County (TW)

(73) Assignee: Taiwan Seimconductor Manufacturing Company Limited, Hsin-Chu (TW)

( * ) Notice: Subject to any disclaimer, the term of this patent is extended or adjusted under 35 U.S.C. 154(b) by 559 days.

(21) Appl. No.: 18/135,238

(22) Filed: Apr. 17, 2023

(65) Prior Publication Data

US 2024/0347360 A1 Oct. 17, 2024

(51) Int. Cl.

| | |
|---|---|
| ***H01L 21/673*** | (2006.01) |
| ***H01L 21/677*** | (2006.01) |
| ***H10P 72/10*** | (2026.01) |
| ***H10P 72/30*** | (2026.01) |

(52) U.S. Cl.

CPC ...... *H10P 72/1928* (2026.01); *H10P 72/3404* (2026.01)

(58) Field of Classification Search

CPC ......... H01L 21/67396; H01L 21/02041; H01L 21/673; H01L 21/677; B08B 6/00; G03F 7/70708; G03F 7/70925; G03F 7/70933; B65D 85/00; B65D 85/38; B65D 85/30; B82Y 25/00; G01L 1/125; G01J 5/0007

USPC .............................................................. 96/28

See application file for complete search history.

(56) References Cited

U.S. PATENT DOCUMENTS

| | | | | |
|---|---|---|---|---|
| 2002/0124906 | A1 * | 9/2002 | Suzuki | H01L 21/67366 141/98 |
| 2011/0220545 | A1 * | 9/2011 | Ra | H10P 72/1916 206/711 |
| 2022/0100105 | A1 * | 3/2022 | Chen | G03F 7/70716 |

OTHER PUBLICATIONS

Static electricity and electrical charge, 2019, Science Learning Hub Pkiipu Akranga Putaiao,https://www.sciencelearn.org.nz/resources/2746-static-electricity-and-electrical-charge (Year: 2019).*

* cited by examiner

*Primary Examiner* — Qianping He

(74) *Attorney, Agent, or Firm* — Cooper Legal Group, LLC

(57) ABSTRACT

A wafer storage device is provided. The wafer storage device includes a floor, a ceiling, and one or more walls between the floor and the ceiling to define a wafer storage chamber for storage of one or more wafers. The apparatus includes a particle-attraction object, having a positive charge or a negative charge, in the wafer storage chamber and configured to attract particles in the wafer storage chamber.

20 Claims, 12 Drawing Sheets

602

APPLY POSITIVE CHARGE OR NEGATIVE CHARGE TO PARTICLE-ATTRACTION OBJECT IN FIRST WAFER STORAGE CHAMBER OF FIRST WAFER STORAGE DEVICE TO ATTRACT PARTICLES IN FIRST WAFER STORAGE CHAMBER TO SURFACE OF PARTICLE-ATTRACTION OBJECT

604

TRANSFER PARTICLE-ATTRACTION OBJECT TO CLEANING TANK

606

CLEAN PARTICLE-ATTRACTION OBJECT IN CLEANING TANK TO REMOVE PARTICLES FROM SURFACE OF PARTICLE-ATTRACTION OBJECT

608

AFTER CLEANING PARTICLE-ATTRACTION OBJECT, TRANSFER PARTICLE-ATTRACTION OBJECT TO FIRST WAFER STORAGE CHAMBER OR SECOND WAFER STORAGE CHAMBER OF SECOND WAFER STORAGE DEVICE

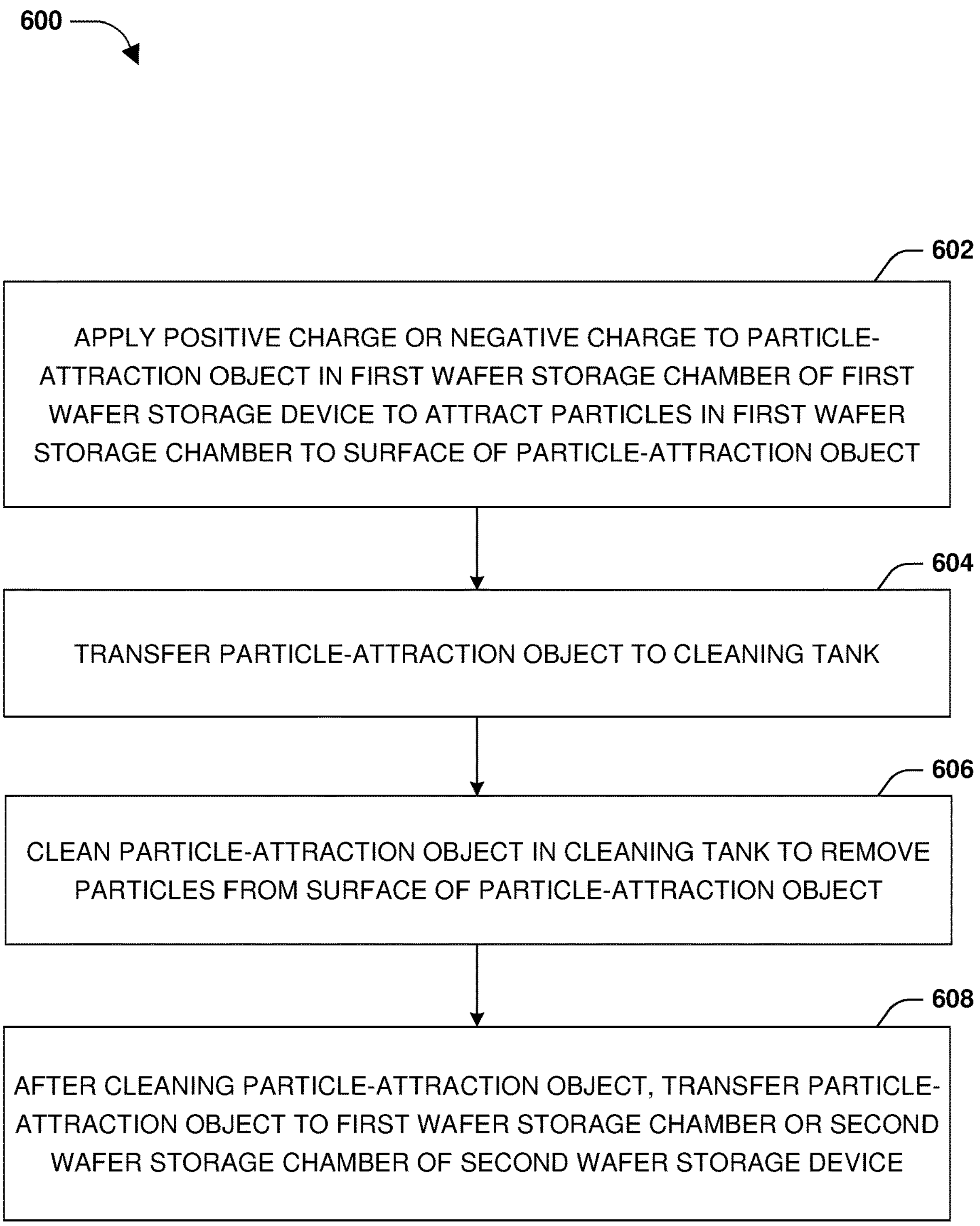

FIG. 6

WAFER STORAGE DEVICE WITH PARTICLE-ATTRACTION OBJECT

BACKGROUND

Generally, material processing, such as wafer processing during semiconductor fabrication, utilizes one or more chambers. For example, a storage chamber stores wafers, a transfer chamber transfers wafers between chambers, and a process chamber is a chamber within which a wafer is processed. During semiconductor fabrication, a wafer often undergoes multiple fabrication processes in different process chambers.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flow diagram illustrating a method, in accordance with some embodiments.

DETAILED DESCRIPTION

Figure 1:
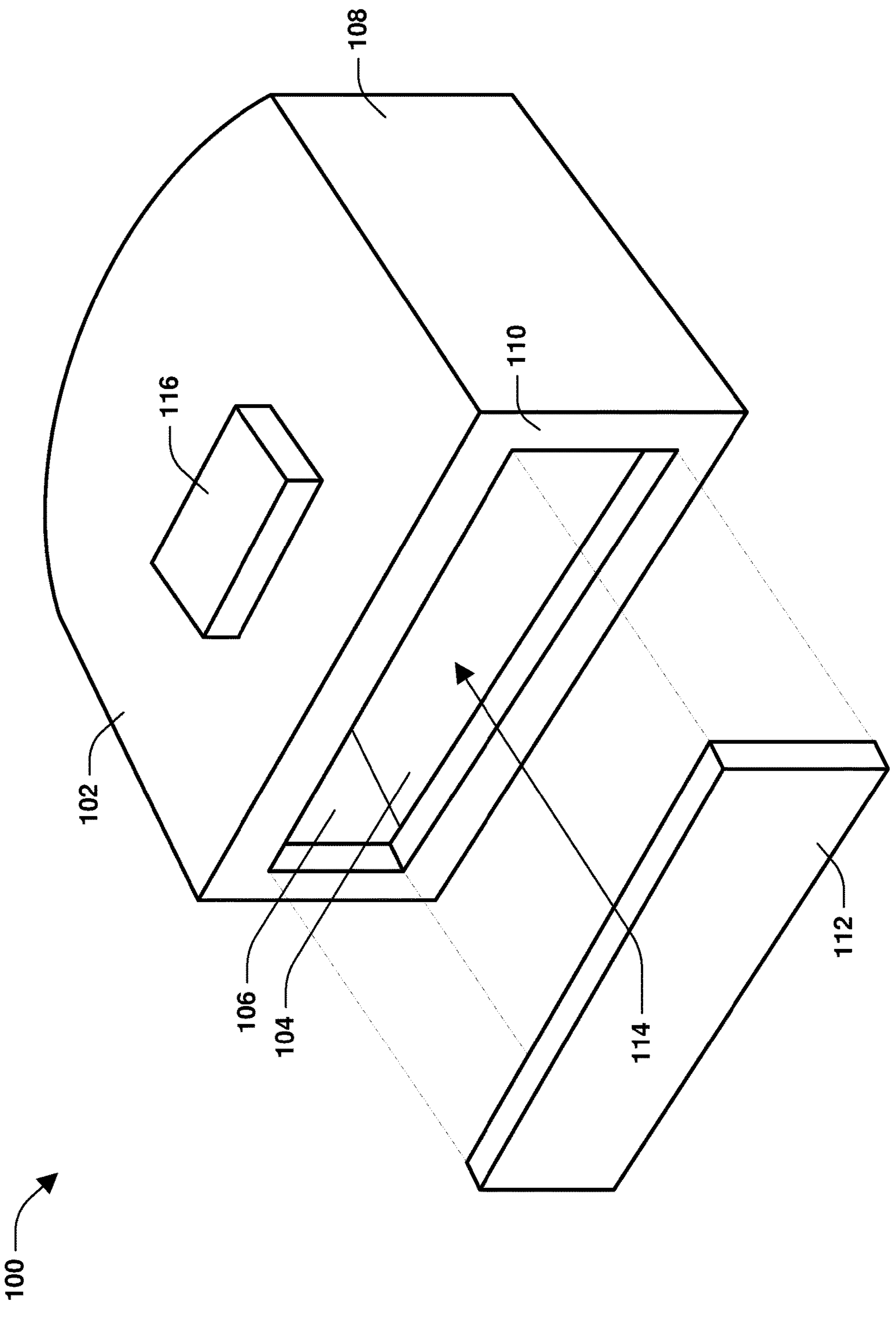
FIG. 1 a perspective view of a wafer storage device, in accordance with some embodiments.

The following disclosure provides several different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals or letters in the various examples. This repetition is for the purpose of simplicity and clarity and does not in itself dictate a relationship between the various embodiments or configurations discussed.

Further, spatially relative terms, such as "beneath," "below," "lower," "above," "upper" and the like, may be used herein for ease of description to describe one element or feature's relationship to other element(s) or feature(s) as illustrated in the figures. The spatially relative terms are intended to encompass different orientations of the device in use or operation in addition to the orientation illustrated in the figures. The apparatus may be otherwise oriented (rotated 90 degrees or at other orientations) and the spatially relative descriptors used herein may likewise be interpreted accordingly.

According to some embodiments, a wafer storage device has a particle-attraction object, such as a rod, tube, ball, etc., in a wafer storage chamber. The particle-attraction object has a positive charge or a negative charge, and is configured to attract particles that are in the wafer storage chamber, such as dust, debris, residue, etc. In some embodiments, the particle-attraction object has a positive charge to attract and adsorb negatively charged particles in the wafer storage chamber and/or a negative charge to attract and adsorb positively charged particles in the wafer storage chamber. In some embodiments, the wafer storage device includes particle-attraction objects having charges with different polarities, so as to attract and adsorb positively charged particles and negatively charged particles. Attracting and adsorbing particles in the wafer storage chamber mitigates accumulation of particles on one or more wafers stored in the wafer storage chamber, thereby improving an integrity of the one or more wafers and reducing wafer defects associated with contamination by the particles.

FIG. 1 illustrates a perspective view of a wafer storage device 100 according to some embodiments. In some embodiments, the wafer storage device 100 is a pod, such as a front opening unified pod (FOUP). The wafer storage device 100 comprises at least one of a floor 104, a ceiling 102, or one or more walls between the floor 104 and the ceiling 102. The one or more walls comprise at least one of a first wall 106, a second wall 108 opposing the first wall 106, a third wall 110 and a fourth wall 309 (shown in FIG. 3A) opposing the third wall 110. In some embodiments, the third wall 110 corresponds to a front side of the wafer storage device 100 and the fourth wall 309 corresponds to a back side of the wafer storage device 100. In some embodiments, the fourth wall 309 is curved. At least one of the floor 104, the ceiling 102, or the one or more walls define a wafer storage chamber 114 for storage of one or more wafers. In some embodiments, the wafer storage device 100 comprises a handle 116 that enables the wafer storage device 100 to be at least one of held or repositioned by at least one of a person or machinery such as a robot. In some embodiments, the handle 116 is coupled to the ceiling 102 of the wafer storage device 100. The third wall 110 defines an opening exposing the wafer storage chamber 114. In some embodiments, the wafer storage device 100 comprises a door 112, fitted to the opening, to provide ingress and egress to the wafer storage chamber 114. In some embodiments, the door 112 is open and a wafer is inserted into the wafer storage chamber 114 through the opening. In some embodiments, the door 112 is closed and the wafer is sealed within the wafer storage chamber 114 by the door 112. In some embodiments, the wafer storage device 100 comprises a transparent material so that the state of the wafer inside the wafer storage chamber 114 is observable from outside the wafer storage device 100. The wafer storage device 100 comprises at least one of plastic or tempered glass. Other materials of the wafer storage device 100 are within the scope of the present disclosure.

In accordance with some embodiments, the wafer storage device 100 comprises a particle-attraction object configured to attract particles in the wafer storage chamber 114, such as suspended particles in the wafer storage chamber 114. In some embodiments, the particles comprise contaminants that can cause defects to a wafer stored in the wafer storage chamber 114. The particles are absorbed into the particle-attraction object, where absorbed can comprise attached to a surface of the particle-attraction object. Accordingly, by attracting the particles in the wafer storage chamber 114, the particle-attraction object mitigates accumulation of unwanted and/or wafer defect-inducing particles on the wafer stored in the wafer storage chamber 114, thereby improving an integrity of the wafer and mitigating particle-induced defects to the wafer. In some embodiments, the particle-attraction object has a positive charge and is configured to attract negatively charged particles in the wafer storage chamber 114. In some embodiments, the particle-attraction object has a negative charge and is configured to attract positively charged particles in the wafer storage chamber 114.

Figure 2A:
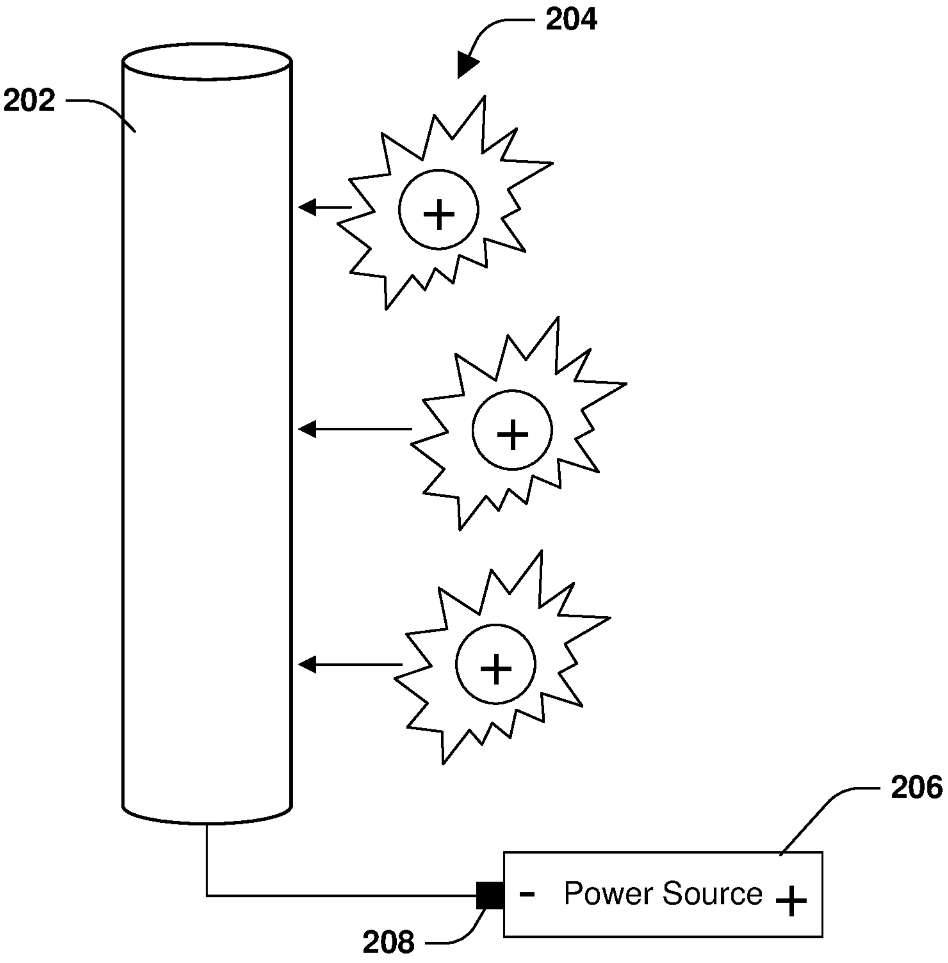
FIG. 2A illustrates a schematic view of a negatively charged particle-attraction object, in accordance with some embodiments.
Figure 2B:
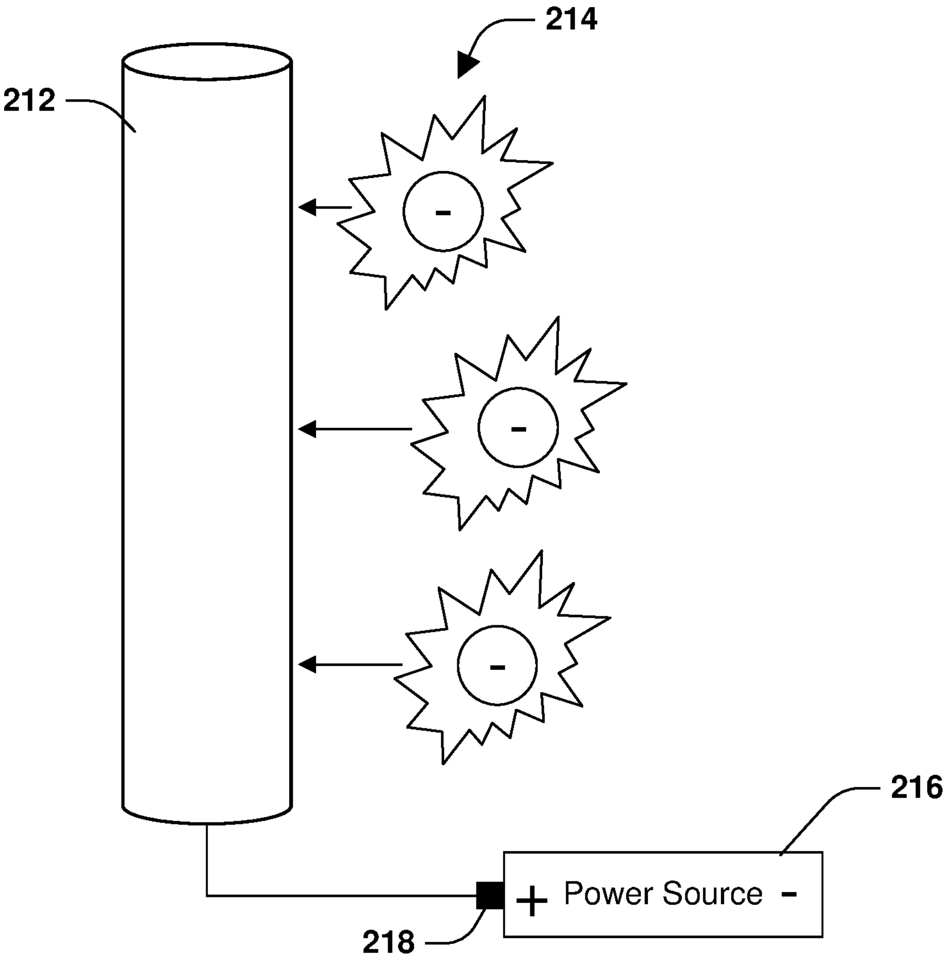
FIG. 2B illustrates a schematic view of a positively charged particle-attraction object, in accordance with some embodiments.
Figure 2C:
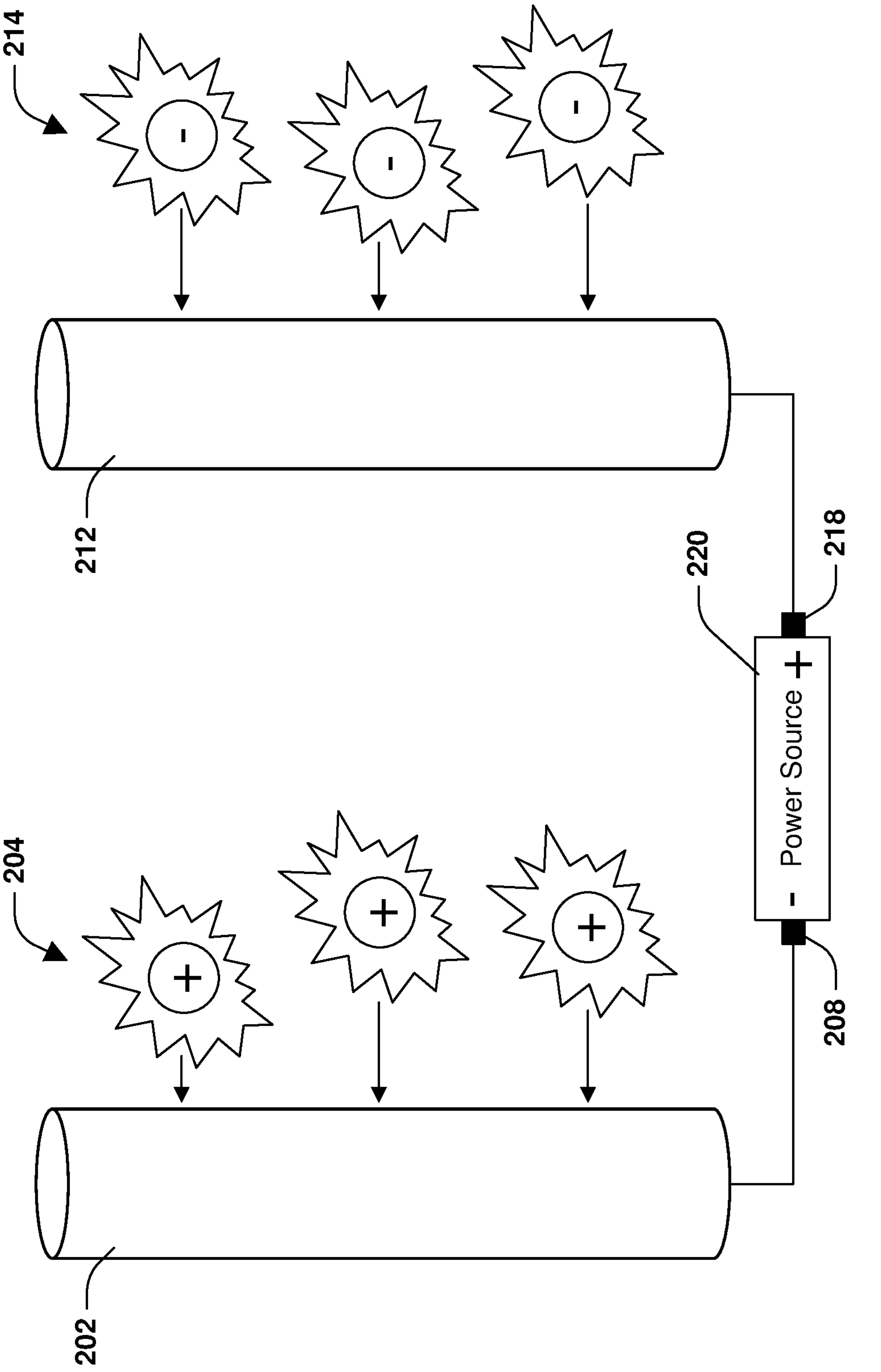
FIG. 2C illustrates a schematic view of a negatively charged particle-attraction object and a positively charged particle-attraction object, in accordance with some embodiments.

FIG. 2A-2C illustrates schematic views of particle-attraction objects according to some embodiments. FIG. 2A illustrates a negatively charged particle-attraction object 202 configured to attract positively charged particles 204 in the wafer storage chamber 114. In some embodiments, the wafer storage device 100 comprises a first power source 206. In some embodiments, a first terminal 208 of the first power source 206, such as a negative terminal of the first power source 206, is coupled to the negatively charged particle-attraction object 202. The first power source 206 imparts a negative charge to the negatively charged particle-attraction object 202 via the first terminal 208. In some embodiments, the first power source 206 comprises a voltage source. In some embodiments, the negatively charged particle-attraction object 202 comprises a rod. In some embodiments, the negatively charged particle-attraction object 202 is cylindrical. Other shapes of the negatively charged particle-attraction object 202 are within the scope of the present disclosure.

FIG. 2B illustrates a positively charged particle-attraction object 212 configured to attract negatively charged particles 214 in the wafer storage chamber 114. In some embodiments, the wafer storage device 100 comprises a second power source 216. In some embodiments, a second terminal 218 of the second power source 216, such as a positive terminal of the second power source 216, is coupled to the positively charged particle-attraction object 212. In some embodiments, the second power source 216 imparts a positive charge to the positively charged particle-attraction object 212 via the second terminal 218. In some embodiments, the second power source 216 comprises a voltage source. In some embodiments, the positively charged particle-attraction object 212 comprises a rod. In some embodiments, the positively charged particle-attraction object 212 is cylindrical. Other shapes of the positively charged particle-attraction object 212 are within the scope of the present disclosure.

In some embodiments, the first power source 206 (shown in FIG. 2A) is different than the second power source 216 (shown in FIG. 2B). FIG. 2C illustrates an embodiment in which the first power source 206 and the second power source 216 correspond to a single power source 220, and the first terminal 208 corresponds to a negative terminal of the single power source 220 and the second terminal 218 corresponds to a positive terminal of the single power source 220. In some embodiments, the single power source 220 comprises a voltage source that applies a voltage across the first terminal 208 and the second terminal 218. The voltage generated by the single power source 220 is between about 0.5 volts to about 10 volts. Other values of the voltage are within the scope of the present disclosure.

Other configurations of particle-attraction objects and/or other techniques for imparting a positive charge or a negative charge to a particle-attraction object are within the scope of the present disclosure.

Figure 3A:
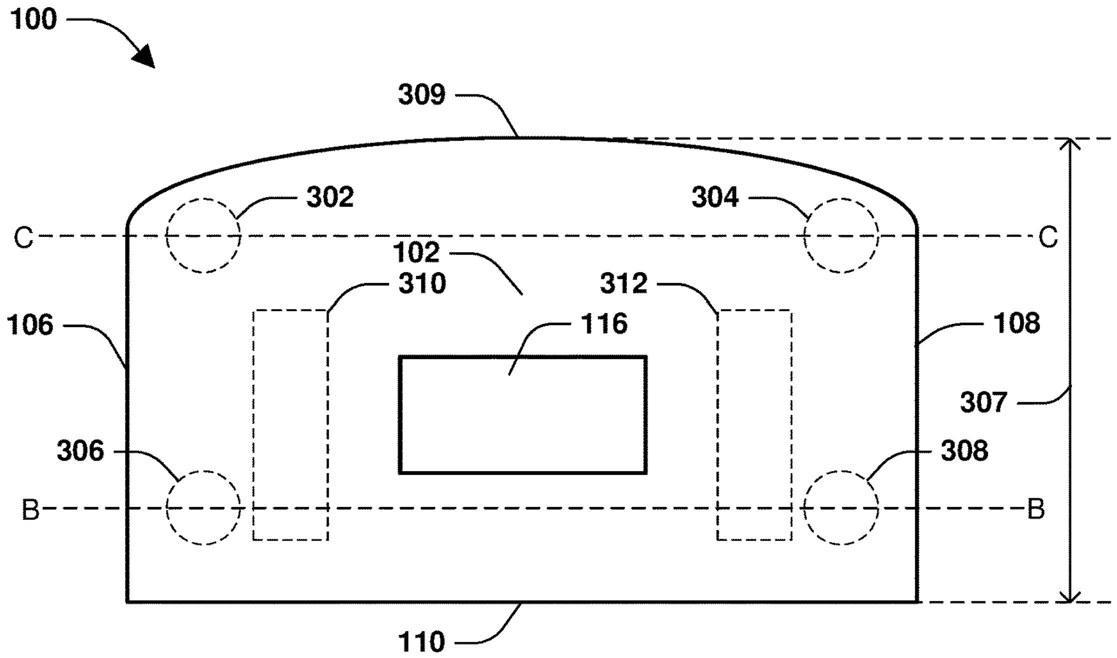
FIG. 3A illustrates a top view of a wafer storage device, in accordance with some embodiments.
Figure 3B:
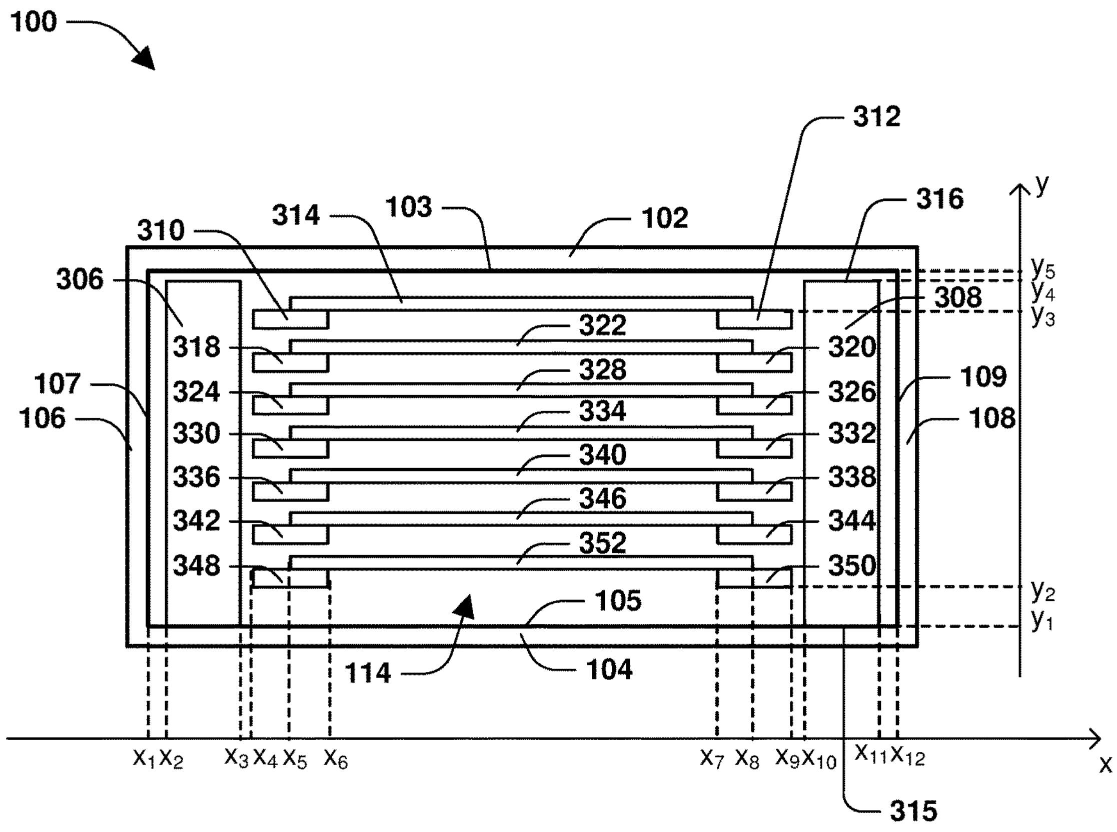
FIG. 3B illustrates a cross-sectional view of a wafer storage device, in accordance with some embodiments.
Figure 3C:
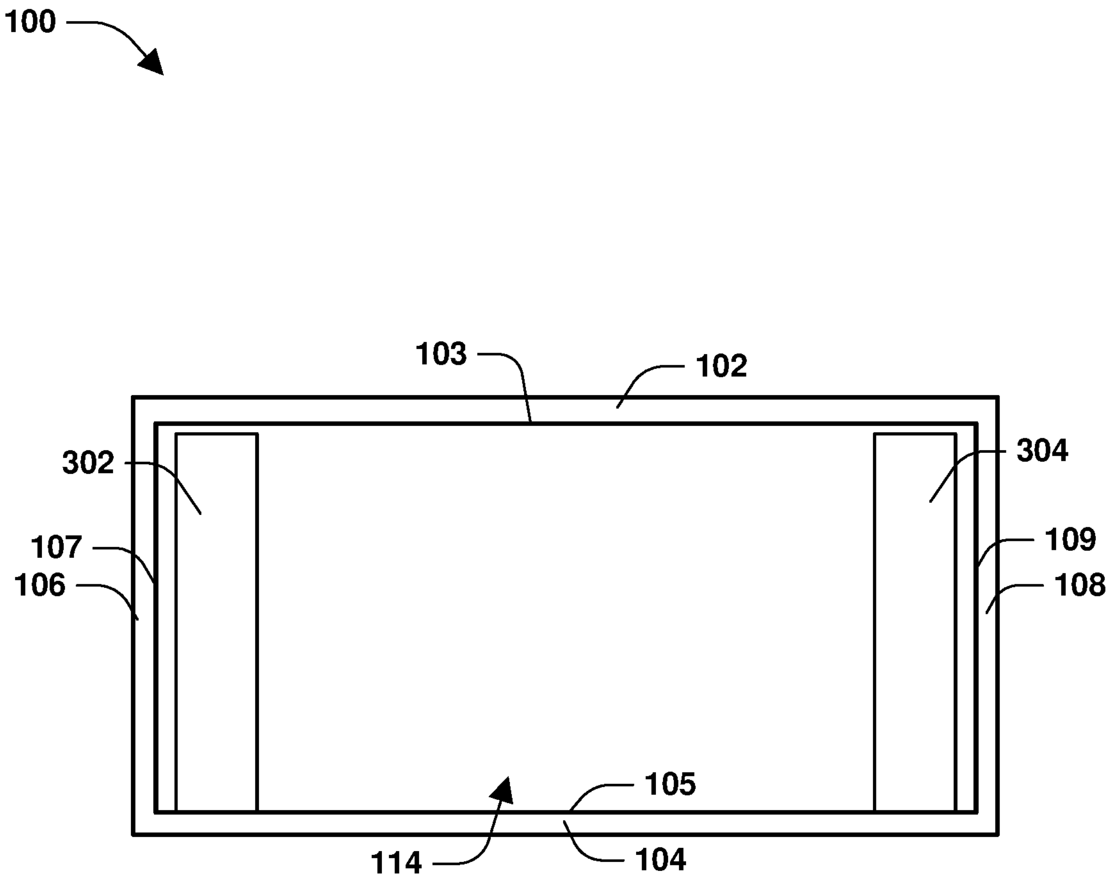
FIG. 3C illustrates a cross-sectional view of a wafer storage device, in accordance with some embodiments.

FIGS. 3A-3C illustrate views of the wafer storage device 100 according to some embodiments. FIG. 3A illustrates a top view of the wafer storage device 100 according to some embodiments. The wafer storage device 100 comprises one or more particle-attraction objects. A shape of a particle-attraction object of the one or more particle-attraction objects is at least one of cylindrical, rectangular, or other shape. At least one of the one or more particle-attraction objects has a shape that is the same as or different than a shape of another one of the one or more particle-attraction objects. Dashed-line circles in FIG. 3A show positions of outer boundaries of the one or more particle-attraction objects relative to the ceiling 102 of the wafer storage device 100 according to some embodiments. The one or more particle-attraction objects at least one of underlie or are covered by the ceiling 102 of the wafer storage device 100. Even though four particle-attraction objects are depicted, any number of particle-attraction objects of the one or more particle-attraction objects are contemplated, such as one, two, three, five, or other number of particle-attraction objects. In some embodiments, the one or more particle-attraction objects comprise a first particle-attraction object 302, a second particle-attraction object 304, a third particle-attraction object 306, and a fourth particle-attraction object 308. In some embodiments, particle-attraction objects of the one or more particle-attraction objects are spaced apart from each other in the wafer storage chamber 114 in any manner, arrangement, orientation, configuration, etc. In some embodiments, each particle-attraction object of one, some or all particle-attraction objects of the one or more particle-attraction objects comprises at least one of a metal, a metal alloy, or other suitable material.

In some embodiments, one or more first particle-attraction objects of the one or more particle-attraction objects have a positive charge, such as a positive charge imparted via a positive terminal of a power source of the wafer storage device 100. The one or more first particle-attraction objects attract negatively charged particles in the wafer storage chamber 114. In some embodiments, one or more second particle-attraction objects of the one or more particle-attraction objects have a negative charge, such as a negative charge imparted via a negative terminal of a power source of the wafer storage device 100. The one or more second particle-attraction objects attract positively charged particles in the wafer storage chamber 114. A quantity of particle-attraction objects of the one or more first particle-attraction objects is equal to a quantity of particle-attraction objects of the one or more second particle-attraction objects. Embodiments are contemplated in which the quantity of particle-attraction objects of the one or more first particle-attraction objects is different than the quantity of particle-attraction objects of the one or more second particle-attraction objects. In some embodiments, each particle-attraction object of the one or more particle-attraction objects in the wafer storage chamber 114 is positively charged or negatively charged using a power source, such as using one or more of the techniques shown in and/or described with respect to FIGS. 2A-2C. In some embodiments, a single power source is used to impart charges to the one or more particle-attraction objects in the wafer storage chamber 114. In some embodiments, multiple power sources are used to impart charges to the one or more particle-attraction objects in the wafer storage chamber 114. In some embodiments, the first particle-attraction object 302 has a positive charge to attract negatively charged particles in the wafer storage chamber 114, the second particle-attraction object 304 has a negative charge to attract positively charged particles in the wafer storage chamber 114, the third particle-attraction object 306 has a negative charge to attract positively charged particles in the wafer storage chamber 114, and the fourth particle-attraction object 308 has a positive charge to attract negatively charged particles in the wafer storage chamber 114. In some embodiments, the first particle-attraction object 302 has a negative charge to attract positively charged particles in the wafer storage chamber 114, the second particle-attraction object 304 has a positive charge to attract negatively charged particles in the wafer storage chamber 114, the third particle-attraction object 306 has a positive charge to attract negatively charged particles in the wafer storage chamber 114, and the fourth particle-attraction object 308 has a negative charge to attract positively charged particles in the wafer storage chamber 114. Other arrangements of positively and/or negatively charged particle-attraction objects in the wafer storage chamber 114 are within the scope of the present disclosure.

In some embodiments, the wafer storage device 100 comprises a support frame assembly, such as an assembly of wafer shelves, configured to support one or more wafers stored in the wafer storage chamber 114. In some embodiments, the one or more wafers are stacked vertically in the wafer storage chamber 114 using the support frame assembly. Dashed-line rectangles in FIG. 3A show positions of outer boundaries of support frames of the support frame assembly relative to the ceiling 102 of the wafer storage device 100 according to some embodiments. The support frames at least one of underlie or are covered by the ceiling 102 of the wafer storage device 100. In some embodiments, the support frames comprise a first support frame 310 and a second support frame 312.

In some embodiments, the one or more wafers, such as a batch of wafers, are temporarily stored in at least one of the wafer storage device 100 or other wafer storage devices during intervals between different processes, such as at least one of etching processes, ashing processes, stripping processes, metal plating processes, chemical mechanical planarization (CMP) processes, deposition processes, physical vapor deposition (PVD) processes, sputtering processes, chemical vapor deposition (CVD) processes, low pressure CVD (LPCVD) processes, atomic layer chemical vapor deposition (ALCVD) processes, ultrahigh vacuum CVD (UHVCVD) processes, reduced pressure CVD (RPCVD) processes, atomic layer deposition (ALD) processes, molecular beam epitaxy (MBE) processes, liquid phase epitaxy (LPE) processes, spin on processes, growth processes, etc.

FIG. 3B illustrates a cross-sectional view of the wafer storage device 100 taken along line B-B of FIG. 3A, and FIG. 3C illustrates a cross-sectional view of the wafer storage device 100 taken along line C-C of FIG. 3A. In some embodiments, the support frame assembly comprises a plurality of sets of support frames in the wafer storage chamber 114. Each set of support frames of the plurality of sets of support frames comprises one or more support frames configured to support a wafer. Referring to FIG. 3B, in some embodiments, the plurality of sets of support frames comprises at least one of (i) a first set of support frames, comprising the first support frame 310 and the second support frame 312, used to support a first wafer 314, (ii) a second set of support frames, comprising a third support frame 318 and a fourth support frame 320, used to support a second wafer 322, (iii) a third set of support frames, comprising a fifth support frame 324 and a sixth support frame 326, used to support a third wafer 328, (iv) a fourth set of support frames, comprising a seventh support frame 330 and an eighth support frame 332, used to support a fourth wafer 334, (v) a fifth set of support frames, comprising a ninth support frame 336 and a tenth support frame 338, used to support a fifth wafer 340, (vi) a sixth set of support frames, comprising an eleventh support frame 342 and a twelfth support frame 344, used to support a sixth wafer 346, or (vii) a seventh set of support frames, comprising a thirteenth support frame 348 and a fourteenth support frame 350, used to support a seventh wafer 352. Even though seven sets of support frames, fourteen support frames, and seven wafers of the one or more wafers stored in the wafer storage chamber 114 are depicted, any number of sets of support frames, support frames, and/or wafers stored in the wafer storage chamber 114 are contemplated.

In some embodiments, one, some or all support frames of the support frame assembly are laterally between the third particle-attraction object 306 and the fourth particle-attraction object 308 such that x-axis positions (on an x-axis shown in FIG. 3B) of the support frames are between an x-axis position of the third particle-attraction object 306 and an x-axis position of the fourth particle-attraction object 308. In some embodiments, the third particle-attraction object 306 occupies at least some of a region, of the wafer storage chamber 114, between x-axis position $x_2$ and x-axis position $x_3$. In some embodiments, the fourth particle-attraction object 308 occupies at least some of a region, of the wafer storage chamber 114, between x-axis position $x_{10}$ and x-axis position $x_{11}$. In some embodiments, x-axis positions of one, some or all support frames of the support frame assembly are between x-axis position $x_3$ associated with the third particle-attraction object 306 and x-axis position $x_{10}$ associated with the fourth particle-attraction object 308.

A first group of support frames of the support frame assembly, such as a left-side group of support frames, comprises at least one of the first support frame 310, the third support frame 318, the fifth support frame 324, the seventh support frame 330, the ninth support frame 336, the eleventh support frame 342, or the thirteenth support frame 348. In some embodiments, the first group of support frames occupies at least some of a region, of the wafer storage chamber 114, between x-axis position $x_4$ and x-axis position $x_6$, wherein the region at least partially occupied by the first group of support frames is between x-axis position $x_3$ associated with the third particle-attraction object 306 and x-axis position $x_{10}$ associated with the fourth particle-attraction object 308.

A second group of support frames of the support frame assembly, such as a right-side group of support frames, comprises at least one of the second support frame 312, the fourth support frame 320, the sixth support frame 326, the eighth support frame 332, the tenth support frame 338, the twelfth support frame 344, or the fourteenth support frame 350. In some embodiments, the second group of support frames occupies at least some of a region, of the wafer storage chamber 114, between x-axis position $x_7$ and x-axis position $x_9$, wherein the region at least partially occupied by the second group of support frames is between x-axis position $x_3$ associated with the third particle-attraction object 306 and x-axis position $x_{10}$ associated with the fourth particle-attraction object 308.

In some embodiments, one, some or all of the one or more wafers stored in the wafer storage chamber 114 are laterally between the third particle-attraction object 306 and the fourth particle-attraction object 308 such that x-axis positions of the wafers are between an x-axis position of the third particle-attraction object 306 and an x-axis position of the fourth particle-attraction object 308. In some embodiments, the one or more wafers stored in the wafer storage chamber 114 occupy at least some of a region, of the wafer storage chamber 114, between x-axis position $x_5$ and x-axis position $x_8$, wherein the region at least partially occupied by the one or more wafers is between x-axis position $x_3$ associated with the third particle-attraction object 306 and x-axis position $x_{10}$ associated with the fourth particle-attraction object 308.

In some embodiments, a distance between x-axis position $x_2$ and x-axis position $x_3$ corresponds to a width, such as a diameter, of the third particle-attraction object 306. The width of the third particle-attraction object 306 is between about 20 millimeters to about 80 millimeters. In some embodiments, a distance between x-axis position $x_{10}$ and x-axis position $x_{11}$ corresponds to a width, such as a diameter, of the fourth particle-attraction object 308. The width of the fourth particle-attraction object 308 is between about 20 millimeters to about 80 millimeters. Other values of the width of the third particle-attraction object 306 and the width of the fourth particle-attraction object 308 are within the scope of the present disclosure. In some embodiments, some or all particle-attraction objects in the wafer storage chamber 114 have about the same width, such as about the same diameter.

In some embodiments, the fourth particle-attraction object 308 extends from a bottom end 315 to a top end 316 at y-axis position $y_4$ (on a y-axis shown in FIG. 3B). The bottom end 315 is in contact with an inner surface 105 of the floor 104, wherein the inner surface 105 of the floor 104 has y-axis position $y_1$. Thus, the bottom end 315 has y-axis position $y_1$. Embodiments are contemplated in which the bottom end 315 is above the inner surface 105 of the floor 104, and thus does not have y-axis position $y_1$. In some embodiments, one, some or all support frames of the support frame assembly occupies at least some of a region, of the wafer storage chamber 114, between y-axis position $y_2$ and y-axis position $y_3$, wherein the region at least partially occupied by the support frames is between the y-axis position, such as y-axis position $y_1$, of the bottom end 315 of the fourth particle-attraction object 308 and y-axis position $y_4$ of the top end 316 of the fourth particle-attraction object 308. Accordingly, one, some or all support frames of the support frame assembly are at an elevation, relative to the floor 104, (i) above the bottom end 315 of the fourth particle-attraction object 308 and (ii) below the top end 316 of the fourth particle-attraction object 308.

In some embodiments, one, some or all wafers of the one or more wafers stored in the wafer storage chamber 114 have y-axis positions that are between the y-axis position, such as y-axis position $y_1$, of the bottom end 315 of the fourth particle-attraction object 308 and y-axis position $y_4$ of the top end 316 of the fourth particle-attraction object 308. Accordingly, one, some or all wafers of the one or more wafers stored in the wafer storage chamber 114 are at an elevation, relative to the floor 104, (i) above the bottom end 315 of the fourth particle-attraction object 308 and (ii) below the top end 316 of the fourth particle-attraction object 308.

In some embodiments, some or all particle-attraction objects in the wafer storage chamber 114 have bottom ends that are at about the same y-axis position, such as y-axis position $y_1$. In some embodiments, some or all particle-attraction objects in the wafer storage chamber 114 have top ends that are at about the same y-axis position, such as y-axis position $y_4$. In some embodiments, one, some and/or all support frames of the support frame assembly are at an elevation, relative to the floor 104, (i) above the bottom end of each particle-attraction object in the wafer storage chamber 114 and (ii) below the top end of each particle-attraction object in the wafer storage chamber 114. In some embodiments, one, some or all wafers of the one or more wafers stored in the wafer storage chamber 114 are at an elevation, (i) above the bottom end of each particle-attraction object in the wafer storage chamber 114 and (ii) below the top end of each particle-attraction object in the wafer storage chamber 114.

In some embodiments, a length of the fourth particle-attraction object 308 corresponds to a distance between the y-axis position, such as y-axis position $y_1$, of the bottom end 315 of the fourth particle-attraction object 308 and y-axis position $y_4$ of the top end 316 of the fourth particle-attraction object 308. In some embodiments, a height of the wafer storage chamber 114 corresponds to a distance between y-axis position $y_1$ of the inner surface 105 of the floor 104 and y-axis position $y_5$ of an inner surface 103 of the ceiling 102. In some embodiments, the length of the fourth particle-attraction object 308 is between about 0.5 times the height of the wafer storage chamber 114 to about equal to the height of the wafer storage chamber 114. Other relationships between the length of the fourth particle-attraction object 308 and the height of the wafer storage chamber 114 are within the scope of the present disclosure. In an embodiment in which the length of the fourth particle-attraction object 308 is about equal to the height of the wafer storage chamber 114, the bottom end 315 of the fourth particle-attraction object 308 may be in contact with the inner surface 105 of the floor 104 and the top end 316 of the fourth particle-attraction object 308 may be in contact with the inner surface 103 of the ceiling 102.

In some embodiments, a width of the wafer storage chamber 114 corresponds to a distance between x-axis position $x_1$ of an inner surface 107 of the first wall 106 and x-axis position $x_{12}$ of an inner surface 109 of the second wall 108. In some embodiments, the width of the fourth particle-attraction object 308 is between about 0.04 times the width of the wafer storage chamber 114 to about 0.25 times the width of the wafer storage chamber 114. Other relationships between the width of the fourth particle-attraction object 308 and the width of the wafer storage chamber 114 are within the scope of the present disclosure.

In some embodiments, some or all particle-attraction objects in the wafer storage chamber 114 are spaced apart at varying differences from a wall, such as at least one of the first wall 106, the second wall 108, the third wall 110 and the fourth wall 309. In some embodiments, a distance between the fourth particle-attraction object 308 and the second wall 108 is different than a distance between the third particle-attraction object 306 and the second wall 108.

Other configurations and/or arrangements of the one or more particle-attraction objects in the wafer storage chamber 114, the support frame assembly, and/or the one or more wafers are within the scope of the present disclosure.

The height of the wafer storage chamber 114 is between about 150 millimeters to about 600 millimeters. The width of the wafer storage chamber 114 is between about 200 millimeters to about 800 millimeters. Other values of the height and the width of the wafer storage chamber 114 are within the scope of the present disclosure. A depth 307 of the wafer storage device 100 (shown in FIG. 3A) is between about 150 millimeters to about 600 millimeters. Other values of the depth 307 are within the scope of the present disclosure.

The one or more particle-attraction objects attract and adsorb particles in the wafer storage chamber 114, where absorb comprises accumulate on surfaces of the one or more particle-attraction objects. Thus, according to some embodiments, an amount of particles accumulated on a surface of a particle-attraction object in the wafer storage chamber 114 increases over time. In some embodiments, an efficacy of the particle-attraction object depends upon the amount of particles accumulated on the surface of the particle-attraction objects. In some embodiments, the efficacy corresponds to at least one of a force of attraction between the particle-attraction object and particles in the wafer storage chamber 114 or a rate at which the particles are adsorbed onto the particle-attraction object. In some embodiments, as compared to when the amount of particles is lower than a threshold amount of particles, the efficacy is lower when the amount of particles exceeds the threshold amount of particles. In some embodiments, the particle-attraction object is cleaned to remove the particles accumulated on the surface of the particle-attraction object, thereby increasing the efficacy of the particle-attraction object.

Figure 4A:
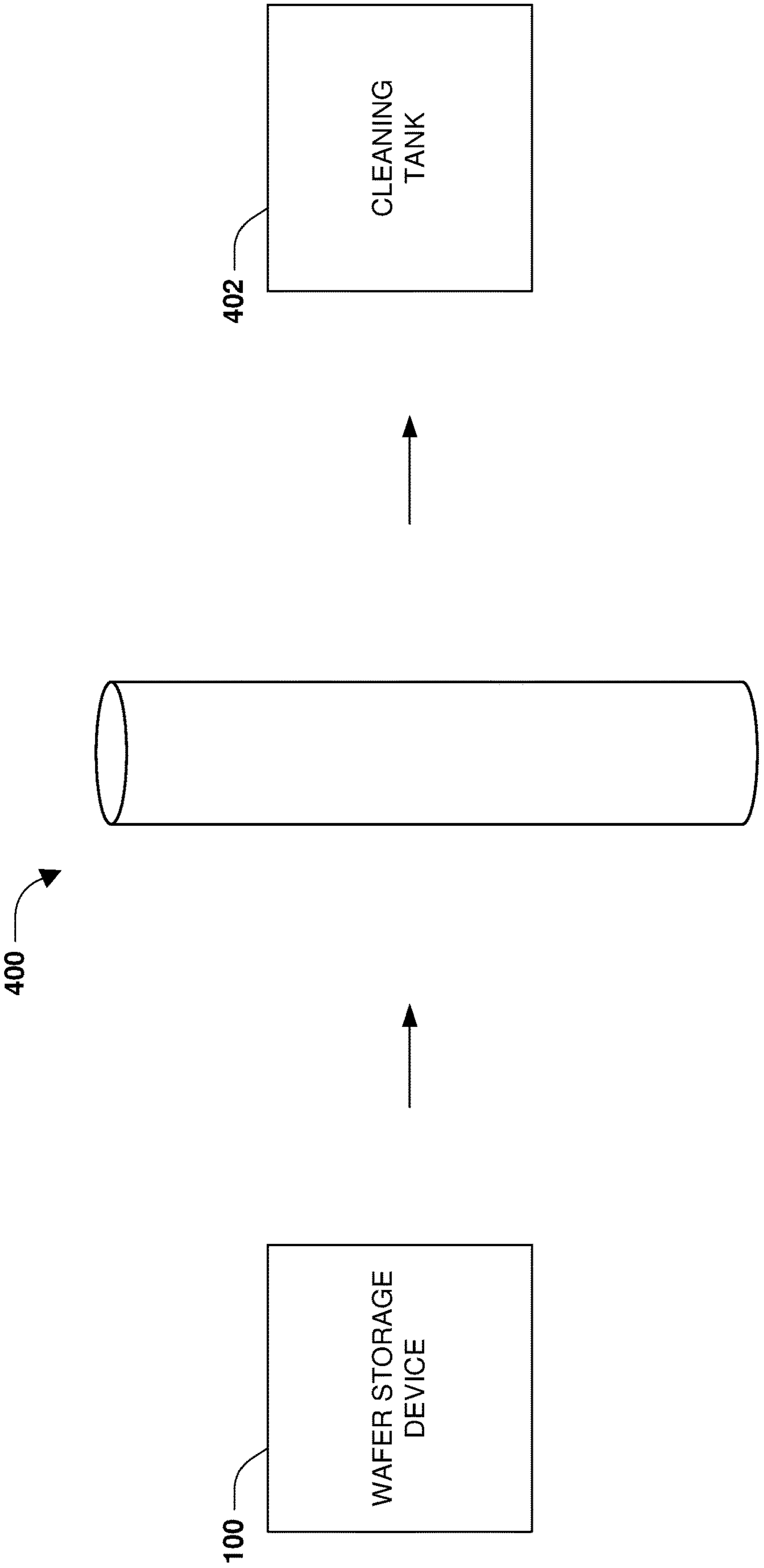
FIG. 4A illustrates movement of a particle-attraction object from a wafer storage device to a cleaning tank, in accordance with some embodiments.
Figure 4B:
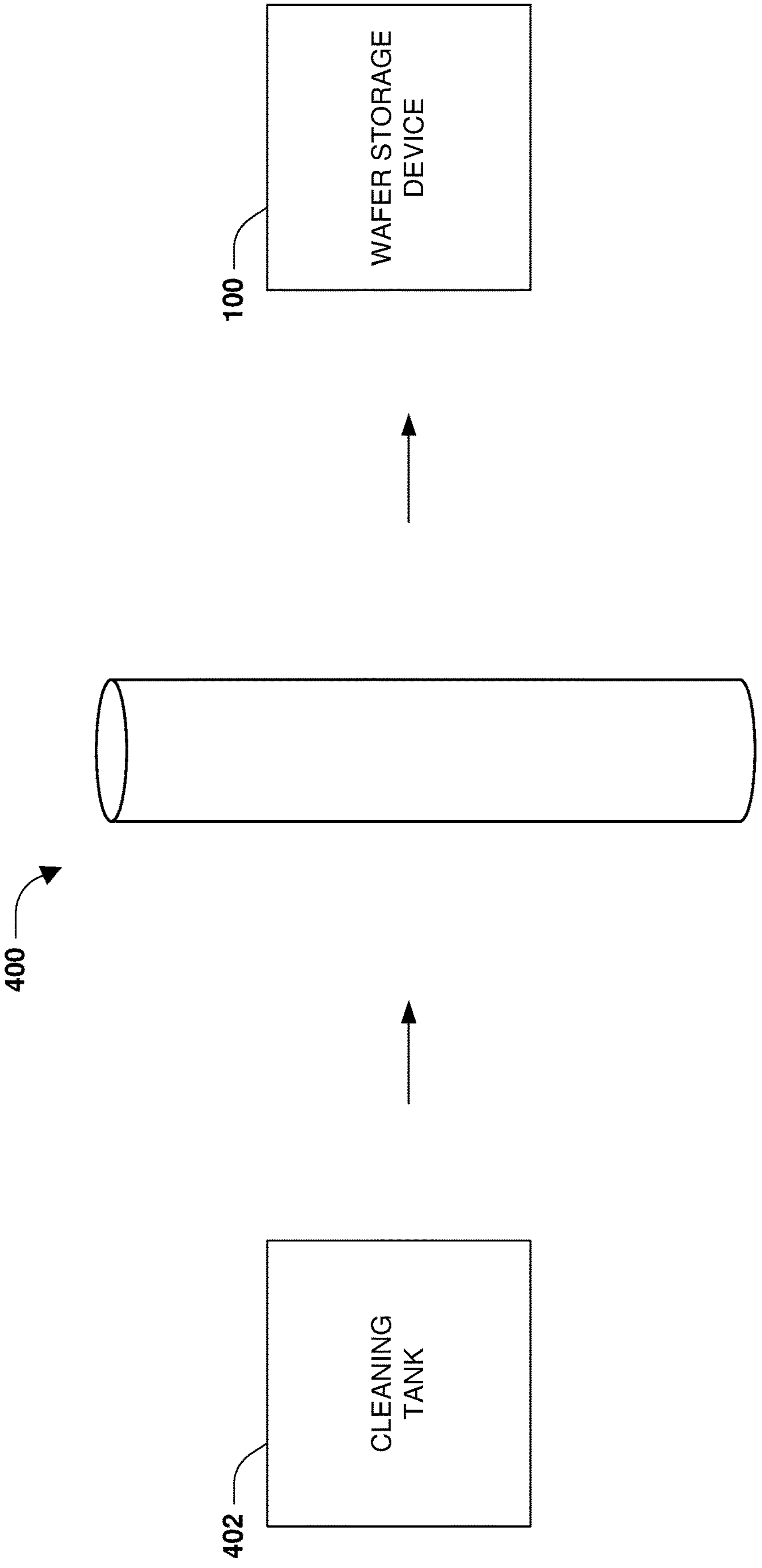
FIG. 4B illustrates movement of a particle-attraction object from a cleaning tank to a wafer storage device, in accordance with some embodiments.

FIGS. 4A-4B illustrates a cleaning process performed to remove particles accumulated on a surface of a particle-attraction object 400 in the wafer storage chamber 114 of the wafer storage device 100. In some embodiments, the particle-attraction object 400 corresponds to at least one of the first particle-attraction object 302, the second particle-attraction object 304, the third particle-attraction object 306, the fourth particle-attraction object 308, or other particle-attraction object in the wafer storage chamber 114.

FIG. 4A illustrates the particle-attraction object 400 transferred from the wafer storage device 100 to a cleaning tank 402, according to some embodiments. At least some of the particle-attraction object 400, such as at least some of the surface of the particle-attraction object 400, is cleaned in the cleaning tank 402. In some embodiments, the particle-attraction object 400 is cleaned with a liquid, such as deionized water or other suitable material. In some embodiments, the cleaning tank 402 comprises a solvent tank. The particle-attraction object 400 is cleaned in the cleaning tank 402 to remove at least some of the particles accumulated on the surface of the particle-attraction object 400. FIG. 4B illustrates the particle-attraction object 400 transferred to the wafer storage device 100, according to some embodiments. In some embodiments, the particle-attraction object 400 is transferred from the cleaning tank 402 to the wafer storage device 100 after cleaning the particle-attraction object 400 in the cleaning tank 402. In some embodiments, an efficacy of the particle-attraction object 400 just prior to transferring the particle-attraction object 400 from the wafer storage device 100 to the cleaning tank 402 is lower than the efficacy of the particle-attraction object 400 just after transferring the particle-attraction object 400 from the cleaning tank 402 to the wafer storage device 100. Embodiments are contemplated in which, in response to cleaning the particle-attraction object 400 in the cleaning tank 402, the particle-attraction object 400 is transferred to a second wafer storage device different than the wafer storage device 100.

In some embodiments, the cleaning process is performed on the particle-attraction object 400 in response to a determination that an amount of particles accumulated on the surface of the particle-attraction object 400 exceeds the threshold amount of particles. In some embodiments, the particle-attraction object 400 is weighed to determine a weight of the particle-attraction object 400. Whether or not the amount of particles accumulated on the surface of the particle-attraction object 400 exceeds the threshold amount of particles is determined based upon the weight. In some embodiments, the weight is compared with a threshold weight, and the determination that the amount of particles accumulated on the surface of the particle-attraction object 400 is based upon a determination that the weight exceeds the threshold weight. In some embodiments, the threshold weight corresponds to a sum of a weight of the particle-attraction object 400 and a weight of the threshold amount of particles. In some embodiments, the particle-attraction object 400 is weighed periodically, such as at least one of once per day, once per 5 days, etc. to check whether the amount of particles accumulated on the surface of the particle-attraction object 400 exceeds the threshold amount of particles.

In some embodiments, the cleaning process is performed on the particle-attraction object 400 periodically, such as at least one of once per day, once per 5 days, etc. In some embodiments, the cleaning process is performed without checking whether the amount of particles accumulated on the surface of the particle-attraction object 400 exceeds the threshold amount of particles, whether the weight of the particle-attraction object 400 exceeds the threshold weight, etc.

In some embodiments, the wafer storage device 100 comprises one or more monitoring devices. In some embodiments, the one or more monitoring devices comprises one or more sensors configured to determine one or more measurements comprising at least one of an amount of particles accumulated on the particle-attraction object 400, one or more amounts of particles in one or more regions of the wafer storage chamber 114, or one or more amounts of particles on one or more regions of one or more wafers stored in the wafer storage chamber 114. In some embodiments, the one or more sensors comprise a camera, and image processing is performed on one or more images generated by the camera to determine the one or more measurements. In some embodiments, the cleaning process is performed on the particle-attraction object 400 based upon the one or more measurements determined using the one or more sensors.

In some embodiments, the one or more monitoring devices comprise a scale used to determine the weight of the particle-attraction object 400. In some embodiments, the one or more measurements comprise an indication of the weight determined using the scale. In some embodiments, the scale is positioned adjacent to, such as underneath, the particle-attraction object 400 in the wafer storage chamber 114. In some embodiments, the weight determined using the scale is monitored, such as by continuously or periodically comparing the weight with the threshold weight. In some embodiments, the cleaning process is performed on the particle-attraction object 400 in response to determining that the weight exceeds the threshold weight.

In some embodiments, a charge imparted to the particle-attraction object 400 by a power source is controlled based upon the one or more measurements, such as increased or decreased based upon an amount of particles on the particle-attraction object increasing or decreasing. In some embodiments, a polarity of the charge is modified from positive to negative or from negative to positive based upon the one or more measurements. In some embodiments, the polarity of the charge is modified from positive to negative in response to a determination, based upon the one or more measurements, that an amount of positively charged particles in a region of the wafer storage chamber 114 exceeds a threshold amount of positively charged particles. In some embodiments, the polarity of the charge is modified from negative to positive in response to a determination, based upon the one or more measurements, that an amount of negatively charged particles in a region of the wafer storage chamber 114 exceeds a threshold amount of negatively charged particles. In some embodiments, a voltage applied by the power source is modified, such as increased or decreased, based upon the one or more measurements.

Figure 5:
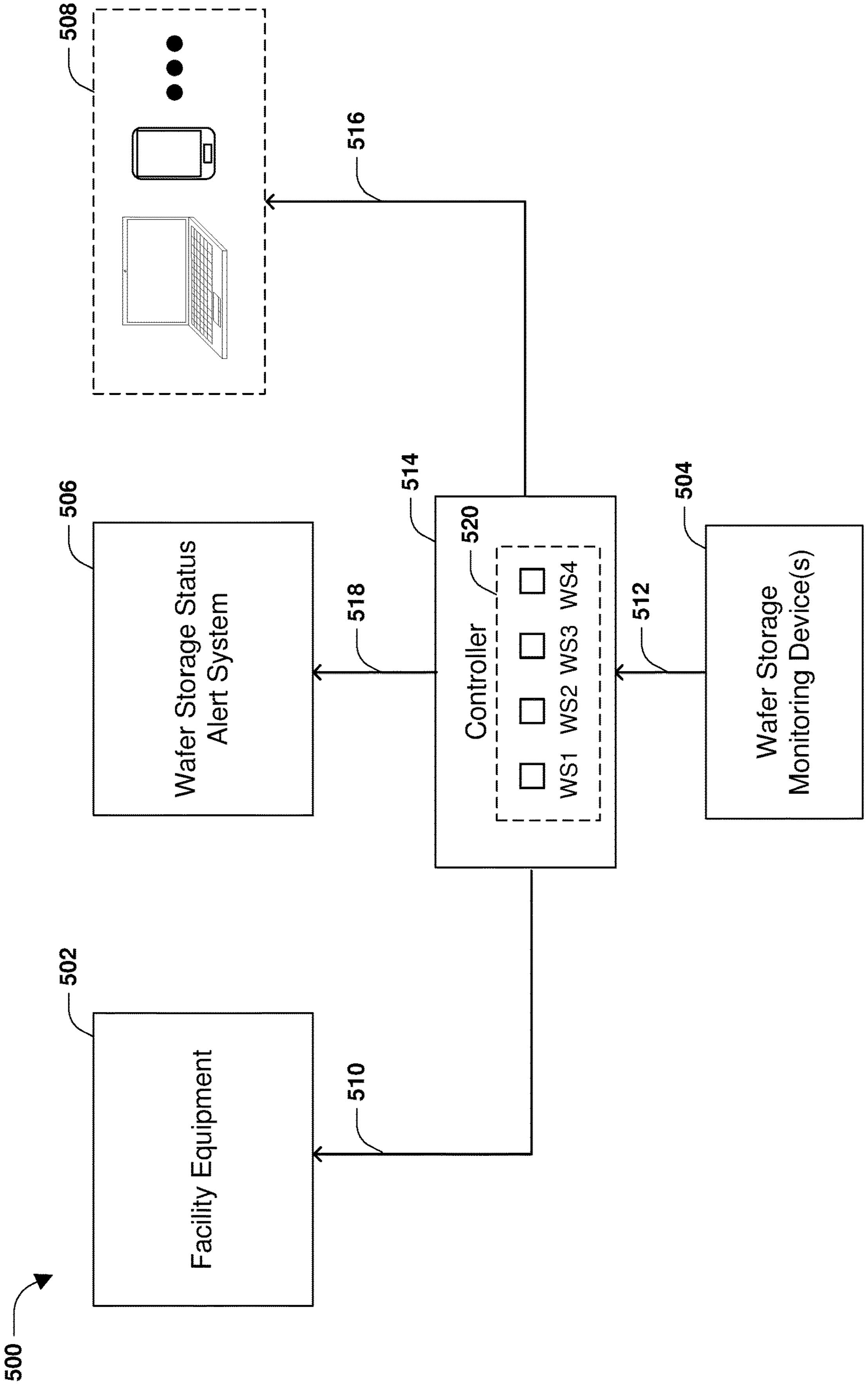
FIG. 5 illustrates a schematic view of a system, in accordance with some embodiments.

FIG. 5 illustrates a schematic view of a system 500 according to some embodiments. The system 500 comprises at least one of a set of wafer storage monitoring devices 504 comprising the one or more monitoring devices of the wafer storage device 100, facility equipment 502 of a facility, a controller 514, a wafer storage status alert system 506, or one or more client devices 508. The set of wafer storage monitoring devices 504 comprises wafer storage monitoring devices distributed at various locations of the facility. The wafer storage monitoring devices are used to determine measurements associated with wafer storage devices in the facility.

In some embodiments, the set of wafer storage monitoring devices 504 transmit a set of measurement signals 512 to the controller 514. In some embodiments, each signal of the set of measurement signals 512 is transmitted by a monitoring device, of the set of wafer storage monitoring devices 504, in a wafer storage device of the facility. In some embodiments, a first measurement signal of the set of measurement signals 512 is provided by the one or more monitoring devices of the wafer storage device 100, a second measurement signal of the set of measurement signals 512 is provided by one or more second monitoring devices of a second wafer storage device, etc. In some embodiments, the first measurement signal is indicative of the one or more measurements associated with the wafer storage device 100. In some embodiments, the second measurement signal is indicative of one or more second measurements associated with the second wafer storage device. Thus, in accordance with some embodiments, the set of wafer storage monitoring devices 504 determine measurements associated with wafer storage devices throughout the facility, and provide the measurements to the controller 514 via the set of measurement signals 512.

In some embodiments, the controller 514 comprises a set of status indicators 520 associated with wafer storage devices in the facility. In some embodiments, an indicator of the set of status indicators 520 comprises a light, such as indicator light, that indicates whether or not one or more particle-attraction objects of a corresponding wafer storage device requires cleaning, wherein the light being in a first state indicates that one or more particle-attraction objects of a corresponding wafer storage device requires cleaning and/or the light being in a second state indicates that no particle-attraction object of a corresponding wafer storage device requires cleaning. In some embodiments, the first state corresponds to a first color emitted by the light, such as red or other color, and the second state corresponds to a second color emitted by the light, such as green or other color. The set of status indicators 520 comprises at least one of a first indicator “WS1” associated with the wafer storage device 100, a second indicator “WS2” associated with the second wafer storage device, a third indicator “WS3” associated with a third wafer storage device, a fourth indicator “WS4” associated with a fourth wafer storage device, or other indicator.

In some embodiments, the controller 514 provides one or more first signals 510 to the facility equipment 502. In some embodiments, the one or more first signals 510 are used to control at least some of the facility equipment 502, such as one, some or all wafer storage devices of the facility and/or other equipment of the facility. In some embodiments, the one or more first signals 510 are generated using a signal generator of the controller 514. The one or more first signals 510 are indicative of at least one of one or more wafer storage monitoring devices that comprise one or more particle-attraction objects that require cleaning, measurements determined using the set of wafer storage monitoring devices 504, or other information. In some embodiments, the controller 514 transmits the one or more first signals 510 to the facility equipment 502 wirelessly, such as using a wireless communication device of the controller 514. In some embodiments, the controller 514 transmits the one or more first signals 510 to the facility equipment 502 over a physical connection between the controller 514 and the facility equipment 502.

In some embodiments, the controller 514 transmits a second signal 518 to the wafer storage status alert system 506. The second signal 518 is generated using the signal generator of the controller 514. In some embodiments, the second signal 518 is indicative of at least one of measurements determined using the set of wafer storage monitoring devices 504 or other information. In some embodiments, the second signal 518 is indicative of at least one of one or more wafer storage monitoring devices that comprise one or more particle-attraction objects that require cleaning, measurements determined using the set of wafer storage monitoring devices 504, or other information. In some embodiments, the controller 514 transmits the second signal 518 to the wafer storage status alert system 506 wirelessly, such as using the wireless communication device of the controller 514. In some embodiments, the controller 514 transmits the second signal 518 to the wafer storage status alert system 506 over a physical connection between the controller 514 and the wafer storage status alert system 506. In some embodiments, the wafer storage status alert system 506 triggers an alarm based upon the second signal 518. In some embodiments, the wafer storage status alert system 506 triggers the alarm based upon the second signal 518 indicating that one or more particle-attraction objects of one or more wafer storage devices require cleaning. In some embodiments, in response to triggering the alarm, an alarm message is displayed via a display of the wafer storage status alert system 506. The alarm message comprises at least one of an indication that one or more particle-attraction objects of the one or more wafer storage devices require cleaning, one or more indications identifying the one or more wafer storage devices, one or more locations of the one or more wafer storage devices or other indication. In some embodiments, an alarm sound is output via a speaker connected to the wafer storage status alert system 506 in response to triggering the alarm.

In some embodiments, the controller 514 transmits a third signal 516 to one or more client devices 508. The one or more client devices 508 comprise at least one of a phone, a smartphone, a mobile phone, a landline, a laptop, a desktop computer, hardware, or other type of client device. The third signal 516 is generated using the signal generator of the controller 514. In some embodiments, the third signal 516 is indicative of at least one of one or more wafer storage monitoring devices that comprise one or more particle-attraction objects that require cleaning, measurements determined using the set of wafer storage monitoring devices 504, or other information. In some embodiments, the controller 514 transmits the third signal 516 to a client device of the one or more client devices 508 wirelessly, such as using the wireless communication device of the controller 514. In some embodiments, the controller 514 transmits the third signal 516 to a client device of the one or more client devices 508 over a physical connection between the controller 514 and the client device. In some embodiments, the third signal 516 comprises a message, such as at least one of an email, a text message, etc., transmitted in response to identifying one or more wafer storage devices with one or more particle-attraction objects that require cleaning. In some embodiments, in response to detecting an electrostatic event in the facility, a telephonic call is made to a client device, such as a landline or a mobile phone, of the one or more client devices 508, such as using a dialer of the controller 514.

In some embodiments, the set of measurement signals 512 are used as feedback based upon which operation of the facility equipment 502 is controlled by the controller 514. In some embodiments, the controller 514 controls operation of the facility equipment 502 based upon measurements indicated by the set of measurement signals 512. In some embodiments, operation of the facility equipment 502 is controlled using the one or more first signals 510. In some embodiments, a signal of the one or more first signals 510 is indicative of one or more instructions.

In some embodiments, one or more wafer storage devices of the facility equipment 502 enter a locked state based upon a signal of the one or more first signals 510, received by the one or more wafer storage devices, at least one of indicating that one or more particle-attraction objects of the one or more wafer storage devices require cleaning or indicating an instruction to enter the locked state. In some embodiments, in the locked state, the one or more wafer storage devices do not allow new batches of wafers to be inserted for storage until the cleaning process is performed on one, some or all particle-attraction objects in the one or more wafer storage devices.

In some embodiments, the one or more first signals 510 comprise a signal transmitted to a machine, such as a robot. In some embodiments, the signal instructs the machine to perform the cleaning process on one, some or all particle-attraction objects in the one or more wafer storage devices. In some embodiments, in response to the signal, the machine retrieves one or more particle-attraction objects from the one or more wafer storage devices and facilitates the cleaning process on the one or more particle-attraction objects. In some embodiments, facilitating the cleaning process comprises at least one of (i) transferring the one or more particle-attraction objects from the one or more wafer storage devices to the cleaning tank 402, (ii) initiating a wash, such as a deionized water wash, in the cleaning tank 402 to remove particles from the one or more particle-attraction objects in the cleaning tank 402, or (iii) transferring the one or more particle-attraction objects back to the one or more wafer storage devices in response to removing particles from the one or more particle-attraction objects in the cleaning tank 402.

A method 600 is illustrated in FIG. 6 in accordance with some embodiments. At 602, a positive charge or a negative charge is applied to a particle-attraction object in a first wafer storage chamber of a first wafer storage device to attract particles in the first wafer storage chamber to a surface of the particle-attraction object. In some embodiments, the particle-attraction object corresponds to at least one of the first particle-attraction object 302, the second particle-attraction object 304, the third particle-attraction object 306, the fourth particle-attraction object 308, the particle-attraction object 400, or other particle-attraction object. In some embodiments, the positive charge or the negative charge is applied using a power source, such as at least one of the first power source 206, the second power source 216, the single power source 220, or other power source. In some embodiments, the first wafer storage device corresponds to the wafer storage device 100, and the first wafer storage chamber corresponds to the wafer storage chamber 114. In some embodiments, concurrently with applying the positive charge or the negative charge to the particle-attraction object in the first wafer storage chamber, a positive charge or a negative charge is applied to one or more particle-attraction objects, different than the particle-attraction object, in the first wafer storage chamber. At 604, the particle-attraction object is transferred to a cleaning tank, such as the cleaning tank 402. At 606, the particle-attraction object is cleaned in the cleaning tank to remove particles from the surface of the particle-attraction object. At 608, after cleaning the particle-attraction object, the particle-attraction object is transferred to the first wafer storage chamber or a second wafer storage chamber of a second wafer storage device. In some embodiments, after transferring the particle-attraction object to the first wafer storage chamber or the second wafer storage chamber, a positive charge or a negative charge is applied to the particle-attraction object using the power source or a different power source to attract particles in the first wafer storage chamber or the second wafer storage chamber to the surface of the particle-attraction object.

Figure 7:
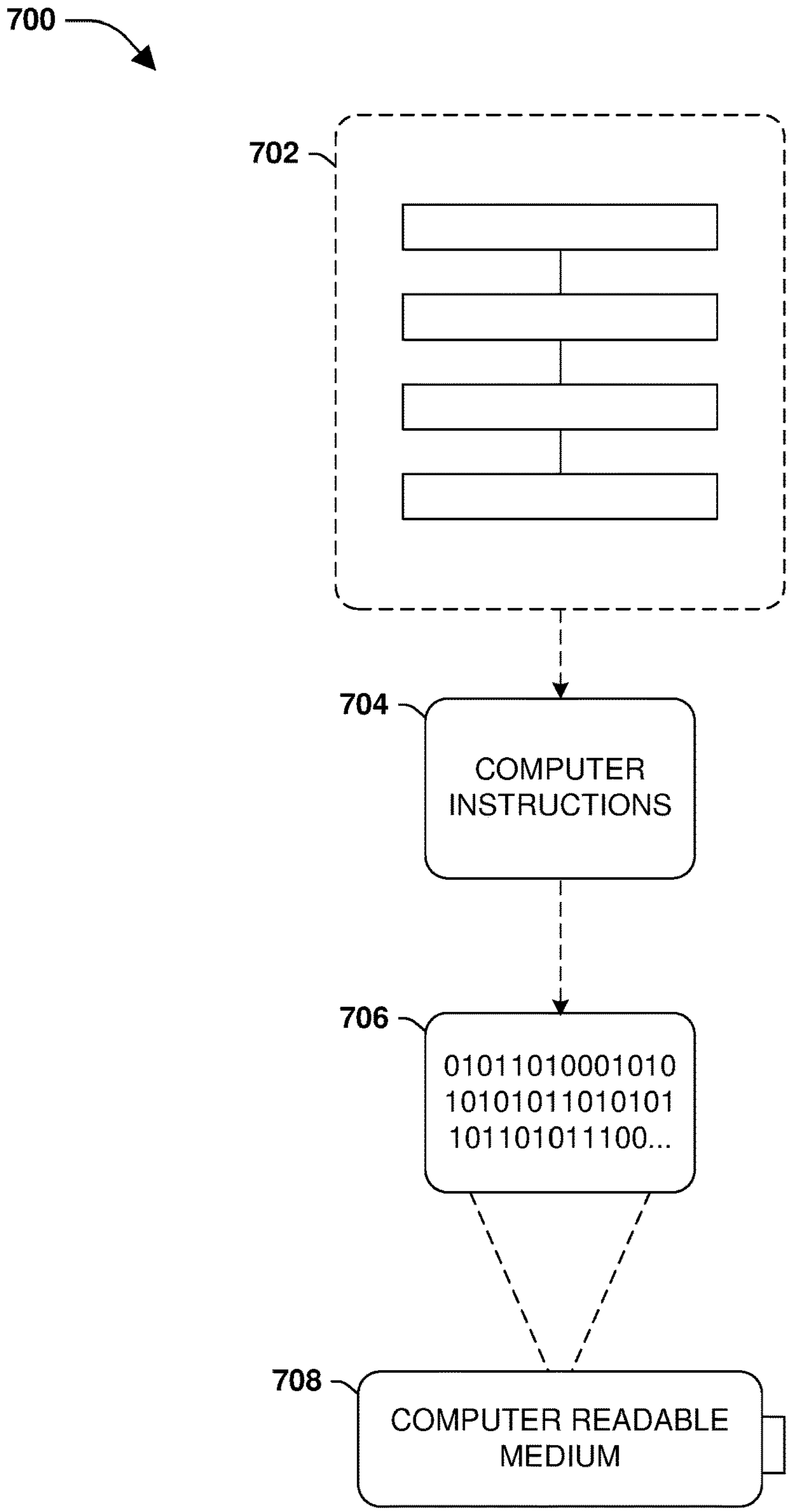
FIG. 7 illustrates an example computer-readable medium wherein processor-executable instructions configured to embody one or more of the provisions set forth herein may be comprised, according to some embodiments.

One or more embodiments involve a computer-readable medium comprising processor-executable instructions configured to implement one or more of the techniques presented herein. An exemplary computer-readable medium is illustrated in FIG. 7, wherein the embodiment 700 comprises a computer-readable medium 708 (e.g., a CD-R, DVD-R, flash drive, a platter of a hard disk drive, etc.), on which is encoded computer-readable data 706. This computer-readable data 706 in turn comprises a set of processor-executable computer instructions 704 configured to implement one or more of the principles set forth herein when executed by a processor. In some embodiments 700, the processor-executable computer instructions 704 are configured to implement a method 702, such as at least some of the one or more aforementioned methods when executed by a processor. In some embodiments, the processor-executable computer instructions 704 are configured to implement a system, such as at least some of the one or more aforementioned systems when executed by a processor. In some embodiments, the processor-executable computer instructions 704 are configured to implement an apparatus, such as at least some of the one or more aforementioned apparatuses when executed by a processor. Many such computer-readable media may be devised by those of ordinary skill in the art that are configured to operate in accordance with the techniques presented herein.

Figure 8:
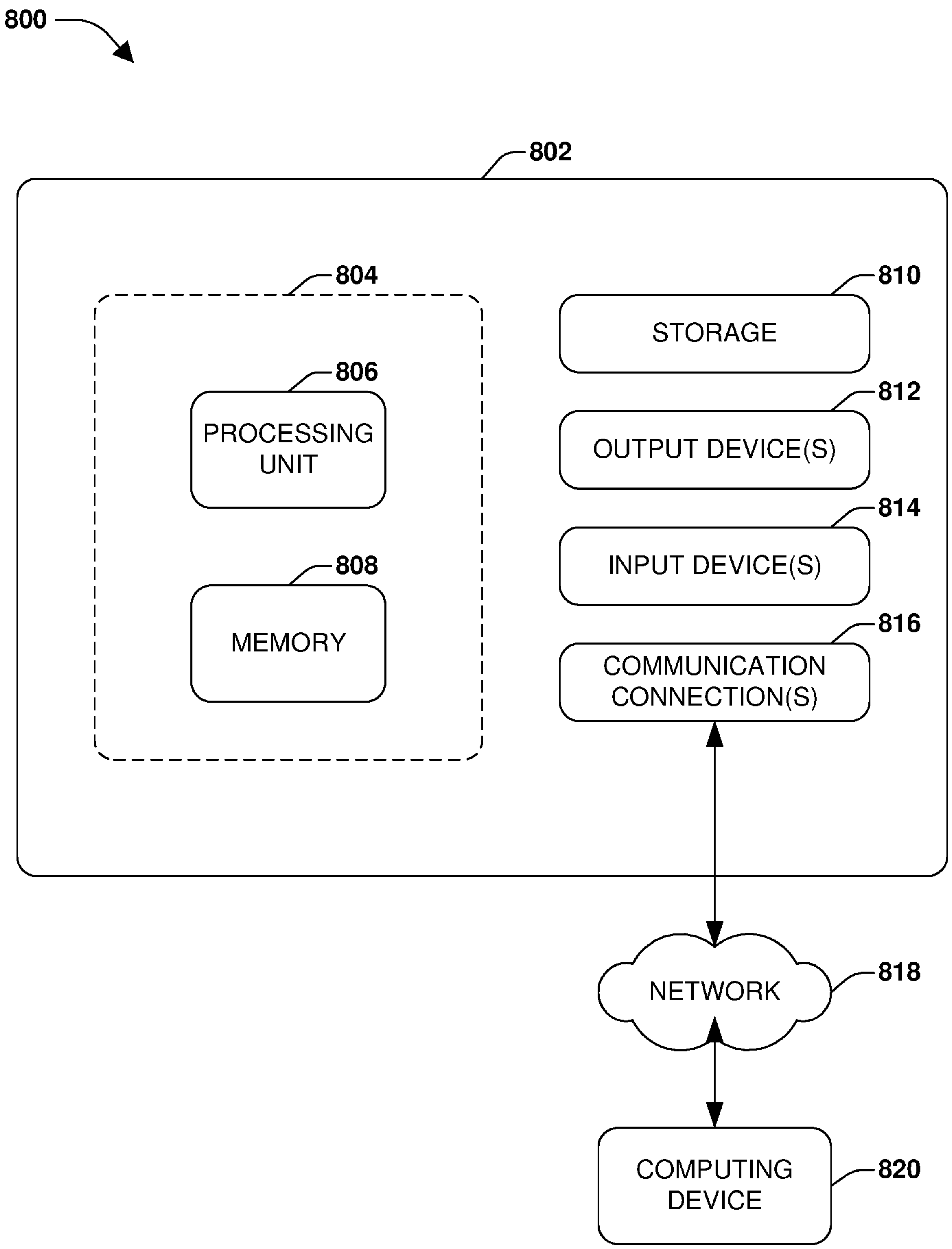
FIG. 8 illustrates an example computing environment wherein one or more of the provisions set forth herein may be implemented, according to some embodiments.

FIG. 8 illustrates an example computing environment wherein one or more of the provisions set forth herein may be implemented, according to some embodiments. FIG. 8 and the following discussion provide a brief, general description of a suitable computing environment to implement embodiments of one or more of the provisions set forth herein. The computing environment of FIG. 8 is only one example of a suitable computing environment and is not intended to suggest any limitation as to the scope of use or functionality of the computing environment. Example computing devices include, but are not limited to, personal computers, server computers, hand-held or laptop devices, mobile devices (such as mobile phones, Personal Digital Assistants (PDAs), media players, and the like), multiprocessor systems, consumer electronics, mini computers, mainframe computers, distributed computing environments that include any of the above systems or devices, and the like.

Although not required, embodiments are described in the general context of "computer readable instructions" and/or the like being executed by one or more computing devices. Computer readable instructions may be distributed via computer readable media (discussed below). Computer readable instructions may be implemented as program modules, such as functions, objects, Application Programming Interfaces (APIs), data structures, and the like, that perform particular tasks or implement particular abstract data types. Typically, the functionality of the computer readable instructions may be combined or distributed as desired in various environments.

FIG. 8 depicts an example of a system 800 comprising a computing device 802 configured as a controller to implement embodiments provided herein. In some configurations, the computing device 802 includes at least one processing unit 806 and memory 808. Depending on the exact configuration and type of computing device, memory 808 may be volatile (such as random-access memory (RAM), for example), non-volatile (such as read-only memory (ROM), flash memory, etc., for example), or some combination of the two. This configuration is illustrated in FIG. 8 by dashed line 804.

In some embodiments, the computing device 802 may include additional features and/or functionality. For example, computing device 802 may also include additional storage (e.g., removable and/or non-removable) including, but not limited to, magnetic storage, optical storage, and the like. Such additional storage is illustrated in FIG. 8 by storage 810. In some embodiments, computer readable instructions to implement one or more embodiments provided herein may be in the storage 810. The storage 810 may also store other computer readable instructions to implement an operating system, an application program, and the like. Computer readable instructions may be loaded in the memory 808 for execution by the processing unit 806, for example.

The term "computer readable media" as used herein includes computer storage media. Computer storage media includes volatile and nonvolatile, removable and non-removable media implemented in any method or technology for storage of information such as computer readable instructions or other data. The memory 808 and the storage 810 are examples of computer storage media. Computer storage media includes, but is not limited to, RAM, ROM, electrically erasable programmable read-only memory (EEPROM), flash memory, or other memory technology, CD-ROM, Digital Versatile Disks (DVDs), or other optical storage, magnetic cassettes, magnetic tape, magnetic disk storage, or other magnetic storage devices, or any other medium which can be used to store the desired information and which can be accessed by the computing device 802. Any such computer storage media may be part of the computing device 802.

The computing device 802 may also include communication connection(s) 816 that allows the computing device 802 to communicate with other devices. The communication connection(s) 816 may include, but is not limited to, a modem, a Network Interface Card (NIC), an integrated network interface, a radio frequency transmitter/receiver, an infrared port, a universal serial bus (USB) connection, or other interfaces for connecting the computing device 802 to other computing devices. The communication connection(s) 816 may include a wired connection or a wireless connection. The communication connection(s) 816 may transmit and/or receive communication media.

The term "computer readable media" may include communication media. Communication media typically embodies computer readable instructions or other data in a "modulated data signal" such as a carrier wave or other transport mechanism and includes any information delivery media. The term "modulated data signal" may include a signal that has one or more of its characteristics set or changed in such a manner as to encode information in the signal.

The computing device 802 may include input device(s) 814 such as keyboard, mouse, pen, voice input device, touch input device, infrared cameras, video input devices, and/or any other input device. Output device(s) 812 such as one or more displays, speakers, printers, and/or any other output device may also be included in the computing device 802. The input device(s) 814 and the output device(s) 812 may be connected to the computing device 802 via a wired connection, wireless connection, or any combination thereof. In some embodiments, an input device or an output device from another computing device may be used as the input device(s) 814 or the output device(s) 812 for the computing device 802.

Components of the computing device 802 may be connected by various interconnects, such as a bus. Such interconnects may include a Peripheral Component Interconnect (PCI), such as PCI Express, USB, firewire (IEEE 1394), an optical bus structure, and the like. In some embodiments, components of the computing device 802 may be interconnected by a network. For example, the memory 808 may be comprised of multiple physical memory units located in different physical locations interconnected by a network.

Those skilled in the art will realize that storage devices utilized to store computer readable instructions may be distributed across a network. For example, a second computing device 820 accessible via a network 818 may store computer readable instructions to implement one or more embodiments provided herein. The computing device 802 may access the second computing device 820 and download a part or all of the computer readable instructions for execution. Alternatively, the computing device 802 may download pieces of the computer readable instructions, as needed, or some instructions may be executed at the computing device 802 and some at the second computing device 820.

In some embodiments, a wafer storage device is provided. The wafer storage device includes a floor, a ceiling, and one or more walls between the floor and the ceiling to define a wafer storage chamber for storage of one or more wafers. The apparatus includes a particle-attraction object, having a positive charge or a negative charge, in the wafer storage chamber and configured to attract particles in the wafer storage chamber.

In some embodiments, a wafer storage device is provided. The wafer storage device includes a floor, a ceiling, and one or more walls between the floor and the ceiling to define a wafer storage chamber for storage of one or more wafers. The apparatus includes a first particle-attraction object, having a positive charge, in the wafer storage chamber and configured to attract negatively charged particles in the wafer storage chamber. The apparatus includes a second particle-attraction object, having a negative charge, in the wafer storage chamber and configured to attract positively charged particles in the wafer storage chamber.

In some embodiments, a method is provided. The method includes applying a positive charge or a negative charge to a particle-attraction object in a first wafer storage chamber of a first wafer storage device to attract particles in the first wafer storage chamber to a surface of the particle-attraction object. The method includes transferring the particle-attraction object to a cleaning tank. The method includes cleaning the particle-attraction object in the cleaning tank to remove the particles from the surface of the particle-attraction object. The method includes after cleaning the particle-attraction object, transferring the particle-attraction object to the first wafer storage chamber or a second wafer storage chamber of a second wafer storage device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as at least one of etching techniques, planarization techniques, implanting techniques, doping techniques, spin-on techniques, sputtering techniques, growth techniques, or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A wafer storage device, comprising:

a floor, a ceiling, and one or more walls between the floor and the ceiling to define a wafer storage chamber for storage of one or more wafers;

a support frame disposed within the wafer storage chamber and configured to support the one or more wafers;

a first particle-attraction object, having a positive charge, in the wafer storage chamber and configured to attract negatively charged particles in the wafer storage chamber;

a second particle-attraction object, having a negative charge, in the wafer storage chamber and configured to attract positively charged particles in the wafer storage chamber; and a third particle-attraction object, having a positive charge or a negative charge, in the wafer storage chamber and configured to attract negatively charged particles or positively charged particles in the wafer storage chamber, wherein:

one of the first particle-attraction object or the second particle-attraction object is disposed between a first wall of the one or more walls and the support frame such that a line extending perpendicular to the first wall intersects the one of the first particle-attraction object or the second particle-attraction object and the support frame, a second one of the first particle-attraction object or the second particle-attraction object is disposed such that no line extending perpendicular to the first wall and intersecting the support frame also intersects the second one of the first particle-attraction object or the second particle-attraction object, and the third particle-attraction object is aligned with the second one of the first particle-attraction object or the second particle-attraction object such that a second line extending perpendicular to the first wall intersects the third particle-attraction object and the second one of the first particle-attraction object or the second particle-attraction object.

2. The wafer storage device of claim 1, comprising:

a power source comprising a first terminal coupled to the first particle-attraction object and a second terminal coupled to the second particle-attraction object, wherein the power source imparts the positive charge to the first particle-attraction object via the first terminal and imparts the negative charge to the second particle-attraction object via the second terminal.

3. The wafer storage device of claim 1, comprising:

a first power source comprising a first terminal coupled to the first particle-attraction object, wherein the first power source imparts the positive charge to the first particle-attraction object via the first terminal; and a second power source comprising a second terminal coupled to the second particle-attraction object, wherein the second power source imparts the negative charge to the second particle-attraction object via the second terminal.

4. The wafer storage device of claim 1, wherein:

the negatively charged particles are adsorbed onto the first particle-attraction object; and the positively charged particles are adsorbed onto the second particle-attraction object.

5. A wafer storage device, comprising:

a floor, a ceiling, and one or more walls between the floor and the ceiling to define a wafer storage chamber for storage of one or more wafers;

a support frame disposed within the wafer storage chamber and configured to support the one or more wafers;

a first particle-attraction object, having a positive charge, in the wafer storage chamber and configured to attract negatively charged particles in the wafer storage chamber;

a second particle-attraction object, having a negative charge, in the wafer storage chamber and configured to attract positively charged particles in the wafer storage chamber;

a third particle-attraction object, having a positive charge or a negative charge, in the wafer storage chamber and configured to attract negatively charged particles or positively charged particles in the wafer storage chamber; and a scale disposed underneath at least one of the first particle-attraction object, second particle-attraction object, or the third particle-attraction object to measure a weight of the at least one of the first particle-attraction object, second particle-attraction object, or the third particle-attraction object, wherein:

one of the first particle-attraction object or the second particle-attraction object is disposed between a first wall of the one or more walls and the support frame such that a line extending perpendicular to the first wall intersects the one of the first particle-attraction object or the second particle-attraction object and the support frame, a second one of the first particle-attraction object or the second particle-attraction object is disposed such that no line extending perpendicular to the first wall and intersecting the support frame also intersects the second one of the first particle-attraction object or the second particle-attraction object, and the third particle-attraction object is aligned with the second one of the first particle-attraction object or the second particle-attraction object such that a second line extending perpendicular to the first wall intersects the third particle-attraction object and the second one of the first particle-attraction object or the second particle-attraction object.

6. The wafer storage device of claim 5, comprising:

a power source comprising a terminal coupled to the first particle-attraction object, wherein the power source imparts the positive charge to the first particle-attraction object via the terminal.

7. The wafer storage device of claim 5, wherein:

the negatively charged particles are adsorbed onto the first particle-attraction object.

8. The wafer storage device of claim 5, wherein:

the first particle-attraction object extends between a first end and a second end in the wafer storage chamber;

the second particle-attraction object extends between a first end and a second end in the wafer storage chamber; and the one or more wafers are at an elevation, relative to the floor:

above the first end of the first particle-attraction object, above the first end of the second particle-attraction object, below the second end of the first particle-attraction object, and below the second end of the second particle-attraction object.

9. The wafer storage device of claim 5, wherein:

a second wall of the one or more walls defines an opening;

the wafer storage device comprises a door fitted to the opening; and the door provides ingress and egress to the wafer storage chamber.

10. The wafer storage device of claim 5, wherein:

the first particle-attraction object is spaced a first distance from the first wall of the one or more walls; and the second particle-attraction object is spaced a second distance, different than the first distance, from the first wall.

11. The wafer storage device of claim 10, wherein the third particle-attraction object is spaced a third distance, different than the first distance, from the first wall.

12. A system, comprising:

a first wafer storage chamber configured to store one or more wafers, the first wafer storage chamber defined by a floor, a ceiling, and one or more walls between the floor and the ceiling;

a support frame disposed within the first wafer storage chamber and configured to support the one or more wafers;

a first particle-attraction object, having a positive charge, in the first wafer storage chamber and configured to attract negatively charged particles in the first wafer storage chamber;

a second particle-attraction object, having a negative charge, in the first wafer storage chamber and configured to attract positively charged particles in the first wafer storage chamber;

a third particle-attraction object, having a positive charge or a negative charge, in the first wafer storage chamber and configured to attract negatively charged particles or positively charged particles in the first wafer storage chamber; and a cleaning tank configured to receive at least one of the first particle-attraction object, the second particle-attraction object, or the third particle-attraction object upon being removed from the first wafer storage chamber, wherein the cleaning tank is configured to remove the negatively charged particles or the positively charged particles from a surface of the at least one of the first particle-attraction object, the second particle-attraction object, or the third particle-attraction object, wherein:

one of the first particle-attraction object or the second particle-attraction object is disposed between a first wall of the one or more walls and the support frame such that a line extending perpendicular to the first wall intersects the one of the first particle-attraction object or the second particle-attraction object and the support frame, a second one of the first particle-attraction object or the second particle-attraction object is disposed such that no line extending perpendicular to the first wall and intersecting the support frame also intersects the second one of the first particle-attraction object or the second particle-attraction object, and the third particle-attraction object is aligned with the second one of the first particle-attraction object or the second particle-attraction object such that a second line extending perpendicular to the first wall intersects the third particle-attraction object and the second one of the first particle-attraction object or the second particle-attraction object.

13. The system of claim 12, comprising:

a second wafer storage chamber configured to receive the at least one of the first particle-attraction object, the second particle-attraction object, or the third particle-attraction object after the negatively charged particles or the positively charged particles are removed from the surface of the at least one of the first particle-attraction object, the second particle-attraction object, or the third particle-attraction object in the cleaning tank.

14. The system of claim 12, comprising:

a wafer storage monitoring device configured to measure an amount of at least one of the negatively charged particles or the positively charged particles on the surface of the at least one of the first particle-attraction object, the second particle-attraction object, or the third particle-attraction object, wherein the at least one of the first particle-attraction object, the second particle-attraction object, or the third particle-attraction object is transferred to the cleaning tank in response to a determination that the amount of the at least one of the negatively charged particles or the positively charged particles exceeds a threshold.

15. The system of claim 12, comprising:

a power source comprising a terminal coupled to the first particle-attraction object, wherein the power source imparts the positive charge to the first particle-attraction object via the terminal.

16. The system of claim 12, wherein:

the first particle-attraction object is spaced a first distance from the first wall of the first wafer storage chamber; and the second particle-attraction object is spaced a second distance, different than the first distance, from the first wall.

17. The system of claim 12, comprising:

a scale disposed underneath the at least one of the first particle-attraction object, the second particle-attraction object, or the third particle-attraction object to measure a weight of the at least one of the first particle-attraction object, the second particle-attraction object, or the third particle-attraction object.

18. The system of claim 12, comprising:

a power source comprising a first terminal coupled to the first particle-attraction object and a second terminal coupled to the second particle-attraction object, wherein the power source imparts the positive charge to the first particle-attraction object via the first terminal and imparts the negative charge to the second particle-attraction object via the second terminal.

19. The system of claim 12, comprising:

a first power source comprising a first terminal coupled to the first particle-attraction object, wherein the first power source imparts the positive charge to the first particle-attraction object via the first terminal; and a second power source comprising a second terminal coupled to the second particle-attraction object, wherein the second power source imparts the negative charge to the second particle-attraction object via the second terminal.

20. The system of claim 12, wherein:

the negatively charged particles are adsorbed onto the first particle-attraction object; and the positively charged particles are adsorbed onto the second particle-attraction object.

* * * * *